US012751337B2

(12) United States Patent
Ge et al.

(10) Patent No.: US 12,751,337 B2
(45) Date of Patent: Sep. 29, 2026

(54) DOUBLE-SIDE-COOLING POWER MODULE

(71) Applicant: Monolithic Power Systems, Inc., Kirkland, WA (US)

(72) Inventors: Ting Ge, San Jose, CA (US); Yingjiang Pu, Chengdu (CN); Hunt Hang Jiang, Saratoga, CA (US); Daocheng Huang, Santa Clara, CA (US); Yuanfeng Zhou, San Jose, CA (US); Qian Li, San Jose, CA (US); Cong Deng, San Jose, CA (US); Zhe Yang, San Jose, CA (US); Wenyang Huang, Hangzhou (CN)

(73) Assignee: Monolithic Power Systems, Inc., Kirkland, WA (US)

( * ) Notice: Subject to any disclaimer, the term of this patent is extended or adjusted under 35 U.S.C. 154(b) by 389 days.

(21) Appl. No.: 18/469,800

(22) Filed: Sep. 19, 2023

(65) Prior Publication Data

US 2025/0096209 A1 Mar. 20, 2025

(51) Int. Cl.

| | |
|---|---|
| ***H10W 90/00*** | (2026.01) |
| ***H01F 27/06*** | (2006.01) |
| ***H01F 27/08*** | (2006.01) |
| ***H01F 27/26*** | (2006.01) |
| ***H01F 37/00*** | (2006.01) |
| ***H10W 70/65*** | (2026.01) |
| ***H10W 74/10*** | (2026.01) |
| *H10W 72/20* | (2026.01) |
| *H10W 74/15* | (2026.01) |

(52) U.S. Cl.

CPC ............ *H10W 90/00* (2026.01); *H01F 27/06* (2013.01); *H01F 27/08* (2013.01); *H01F 27/266* (2013.01); *H01F 37/00* (2013.01); *H10W 70/65* (2026.01); *H10W 74/114* (2026.01); *H10W 72/227* (2026.01); *H10W 72/232* (2026.01); *H10W 72/237* (2026.01); *H10W 74/15* (2026.01); *H10W 90/724* (2026.01); *H10W 90/734* (2026.01)

(58) Field of Classification Search

CPC ... H10W 90/00; H10W 70/65; H10W 74/114; H10W 72/227; H10W 70/614; H01F 27/06; H01F 27/08; H01F 27/266; H01F 37/00

See application file for complete search history.

(56) References Cited

U.S. PATENT DOCUMENTS

| | | | |
|---|---|---|---|
| 6,885,278 | B2 | 4/2005 | Nakao et al. |
| 8,064,202 | B2 | 11/2011 | Yin et al. |
| 8,064,211 | B2 | 11/2011 | Furukawa et al. |
| 8,218,331 | B2 | 7/2012 | Furukawa et al. |
| 8,263,437 | B2 | 9/2012 | Lin et al. |

(Continued)

*Primary Examiner* — S M Sohel Imtiaz

(74) *Attorney, Agent, or Firm* — Ashurst Perkins Coie US LLP

(57) ABSTRACT

A power module, having a bottom substrate, a device substrate arranged on the bottom substrate and an inductor assembly arranged on the device substrate. The device substrate having a first power device chip and a second power device chip embedded within the device substrate. Each power device chip has a first surface and a second surface. The first surface of each power device chip is covered by a top heat layer, and the second surface of each power device chip has a plurality of pins or pads exposed on the second surface of the device substrate, and connected to the bottom substrate.

7 Claims, 6 Drawing Sheets

(56) References Cited

U.S. PATENT DOCUMENTS

| | | | |
|---|---|---|---|
| 8,445,990 B2 | 5/2013 | Lin et al. | |
| 8,604,597 B2 | 12/2013 | Jiang | |
| 8,742,490 B2 | 6/2014 | Disney | |
| 8,910,369 B2 | 12/2014 | Herbsommer et al. | |
| 9,685,880 B2 | 6/2017 | Akre | |
| 9,711,279 B2 | 7/2017 | Todorov et al. | |
| 9,729,059 B1 | 8/2017 | Parto et al. | |
| 9,911,720 B1 | 3/2018 | Cho et al. | |
| 10,104,764 B2 | 10/2018 | Stepniak et al. | |
| 10,111,333 B2 | 10/2018 | Yin et al. | |
| 10,324,502 B2 | 6/2019 | Yazaki | |
| 10,333,407 B2 | 6/2019 | Todorov et al. | |
| 10,340,210 B2 | 7/2019 | Khoo et al. | |
| 10,361,631 B2 | 7/2019 | Zhou | |
| 10,581,327 B2 | 3/2020 | Zhou | |
| 10,593,566 B2 | 3/2020 | Parrish et al. | |
| 10,693,378 B2 | 6/2020 | Zhou | |
| 10,855,178 B2 | 12/2020 | Tschirhart et al. | |
| 11,227,856 B2 | 1/2022 | Ji et al. | |
| 11,398,333 B2 | 7/2022 | Huang et al. | |
| 11,456,262 B2 | 9/2022 | Sato et al. | |
| 11,503,731 B2 | 11/2022 | Ye et al. | |
| 11,676,756 B2 | 6/2023 | Ji et al. | |
| 11,682,515 B2 | 6/2023 | Huang et al. | |
| 11,735,352 B2 | 8/2023 | Clavette et al. | |
| 11,901,113 B2 | 2/2024 | Ji et al. | |
| 11,996,771 B2 | 5/2024 | Palm et al. | |
| 12,088,205 B2 | 9/2024 | Leong et al. | |
| 12,094,639 B2 | 9/2024 | Wang et al. | |
| 12,131,988 B2 | 10/2024 | Kessler et al. | |
| 12,142,407 B2 | 11/2024 | Peluso et al. | |
| 12,150,236 B2 | 11/2024 | Deboy et al. | |
| 12,154,937 B2 | 11/2024 | Clavette et al. | |
| 12,198,844 B2 | 1/2025 | Ikriannikov et al. | |
| 12,243,673 B2 | 3/2025 | Clavette et al. | |
| 2011/0033193 A1* | 2/2011 | Nakamura | H01S 5/042<br>332/178 |
| 2012/0193772 A1 | 8/2012 | Jiang | |
| 2013/0057239 A1* | 3/2013 | Kalje | H02M 3/1584<br>323/271 |
| 2013/0201631 A1* | 8/2013 | Parker | H05K 1/0298<br>361/728 |
| 2019/0006076 A1 | 1/2019 | Yazaki | |
| 2019/0096791 A1* | 3/2019 | Jeng | H10W 70/611 |
| 2019/0109538 A1* | 4/2019 | Zhou | H05K 1/181 |
| 2020/0020635 A1* | 1/2020 | Chang | H10W 70/611 |
| 2021/0118601 A1 | 4/2021 | Leong et al. | |
| 2021/0118805 A1* | 4/2021 | Sio | H10W 70/614 |
| 2022/0149738 A1 | 5/2022 | Hong et al. | |
| 2022/0295635 A1* | 9/2022 | Huang | H05K 1/144 |
| 2022/0295638 A1 | 9/2022 | Huang et al. | |
| 2022/0369464 A1 | 11/2022 | Huang et al. | |
| 2023/0187365 A1* | 6/2023 | Lin | G11C 11/418<br>257/774 |
| 2023/0335509 A1 | 10/2023 | Poddar | |
| 2024/0006259 A1 | 1/2024 | Hidetoshi et al. | |
| 2024/0039421 A1 | 2/2024 | Meyer et al. | |
| 2024/0249870 A1 | 7/2024 | Kshirsagar et al. | |
| 2025/0029769 A1 | 1/2025 | Luo et al. | |

* cited by examiner

DOUBLE-SIDE-COOLING POWER MODULE

TECHNICAL FIELD

The present invention generally relates to electrical components, and more particularly but not exclusively relates to power modules.

BACKGROUND

Power converter, as known in the art, converts an input power to an output power for providing a load with required voltage and current. Multi-phase power converter comprising a plurality of paralleled power stages operating out of phase has lower output ripple voltage, better transient performance and lower ripple-current-rating requirements for input capacitors. They are widely used in high current and low voltage applications, such as server, and microprocessor.

With the development of modern GPUs (Graphics Processing Units), and CPUs (Central Processing Units), increasingly high load current is required to achieve better processor performance. Furthermore, to improve integration, the size of power modules needs to be smaller. Higher current and smaller size put more challenges to the heat conduction. Therefore, it is desirable to provide a power module with high-power density, high-efficiency and excellent heat dissipation capability in space-constrained environments.

SUMMARY

It is an object of the present invention to provide a power module with stacked inductors and power device chips.

The embodiments of the present invention are directed to a power module, including a bottom substrate, a device substrate and an inductor assembly. The bottom substrate has a first surface and a second surface opposite to the first surface. The device substrate is arranged on the bottom substrate. The device substrate has a first surface and a second surface opposite to the first surface of the device substrate, and the second surface of the device substrate faces the first surface of the bottom substrate. The inductor assembly is arranged on the device substrate. The inductor assembly has a first surface and a second surface opposite to the first surface of the inductor assembly, and the second surface of the inductor assembly faces the first surface of the device substrate. The device substrate includes a first power device chip and a second power device chip embedded within the device substrate. Each one of the first power device chip and the second power device chip has a first surface and a second surface. The first surface of each one of the first power device chip and the second power device chip is covered by a top heat layer. The second surface of each one of the first power device chip and the second power device chip has a plurality of pins or pads exposed on the second surface of the device substrate, and connected to the bottom substrate.

The embodiments of the present invention are directed to a power module includes a device substrate. The device substrate has a first surface and a second surface opposite to the first surface. The device substrate includes at least one power device chip embedded within the device substrate and at least one pair of connecting pillars embedded within the device substrate. The at least one pair of connecting pillars includes a first connecting pillar and a second connecting pillar arranged at opposite sides of the at least one power device chip. The at least one power device chip has a first surface covered by a top heat layer exposed on the first surface of the device substrate, and a second surface includes a plurality of pins exposed on the second surface of the device substrate. The first surface and the second surface of the at least one power device chip are opposite.

The embodiments of the present invention are directed to a power module includes a bottom substrate and a device substrate. The bottom substrate has a first surface and a second surface opposite to the first surface. The device substrate is arranged on the bottom substrate. The device substrate has a first surface and a second surface opposite to the first surface of the device substrate. The device substrate includes a first power device chip and a second power device chip. The first power device chip and the second power device chip are embedded within the device substrate. Each one of the first power device chip and second power device chip has a first surface covered by a top heat layer which is exposed on the first surface of the device substrate, and a second surface includes a plurality of pins. The first surface and the second surface of each one of the first power device chip and second power device chip are opposite. The plurality of pins of each one of the first power device chip and second power device chip are soldered to the first surface of the bottom substrate.

BRIEF DESCRIPTION OF THE DRAWINGS

The present invention can be further understood with reference to the following detailed description and the appended drawings, wherein like elements are provided with like reference numerals. The drawings are only for illustration purpose. They may only show part of the devices and are not necessarily drawn to scale.

DETAILED DESCRIPTION

Figure 1:
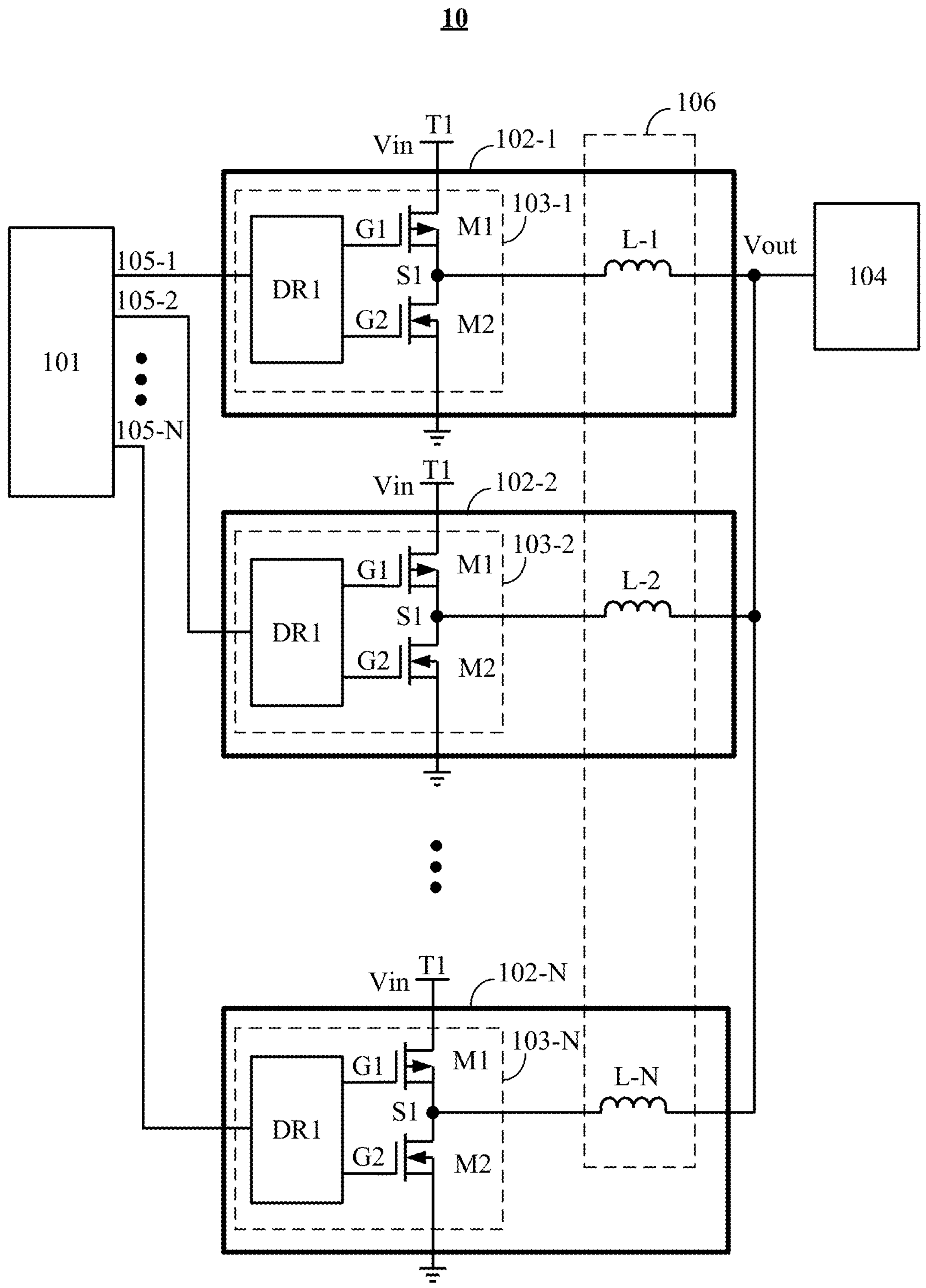
FIG. 1 (Prior Art)
FIG. 1 schematically shows a prior art multi-phase power converter 10 which comprises a controller 101, N power devices 103 and N inductors L1 for supplying power to a load 104.

In the present disclosure, numerous specific details are provided, such as examples of electrical circuits and components, to provide a thorough understanding of embodiments of the invention. Persons of ordinary skill in the art will recognize, however, that the invention can be practiced without one or more of the specific details. It is noted that, for purposes of illustrative clarity, certain elements in the drawings may not be drawn to scale. In other instances, well-known details are not shown or described to avoid obscuring aspects of the invention.

FIG. 1 schematically shows a prior art multi-phase power converter 10 which comprises a controller 101, N power blocks 103-1~103-N and N inductors L-1~L-N for supplying power to a load 104, wherein N is an integer, and N≥1. Each power block 103 and one inductor L represent one power stage, i.e., one phase 102 of the power converter 10, as shown in FIG. 1. Each power block 103 includes switches M1, M2 and a driver DR1 for providing driving signals G1 and G2 to drive the switches M1 and M2 respectively. The controller 101 provides N phase control signals 105-1~105-N respectively to N power blocks 103-1~103-N to control the N phases 102-1~102-N working out of phase, i.e., each one of the inductors L-1~L-N sequentially absorb power from the input source and sequentially deliver power to the load 104. It should be noticed that the outputs of all phases as shown in FIG. 1 are connected to work as a multi-phase converter. However, each phase output may be separated to work as multiple independent converters which could have different output voltage levels for different load demands.

The power stage 102 with Buck topology is shown in FIG. 1 for example. Persons of ordinary skill in the art should appreciate that power stages with other topologies, like Boost topology, Buck-Boost topology could also be adopted in a multi-phase power converter.

The inductors L-1~L-N could be implemented by one or a few coupled inductors or could be implemented by N single inductors.

When N=2, the multi-phase power converter 10 is used as a dual-phase power converter or two separate single-phase converters. For the ease of description, dual-phase power module for a dual-phase power converter is discussed as an example to illustrate the present invention.

Figure 2:
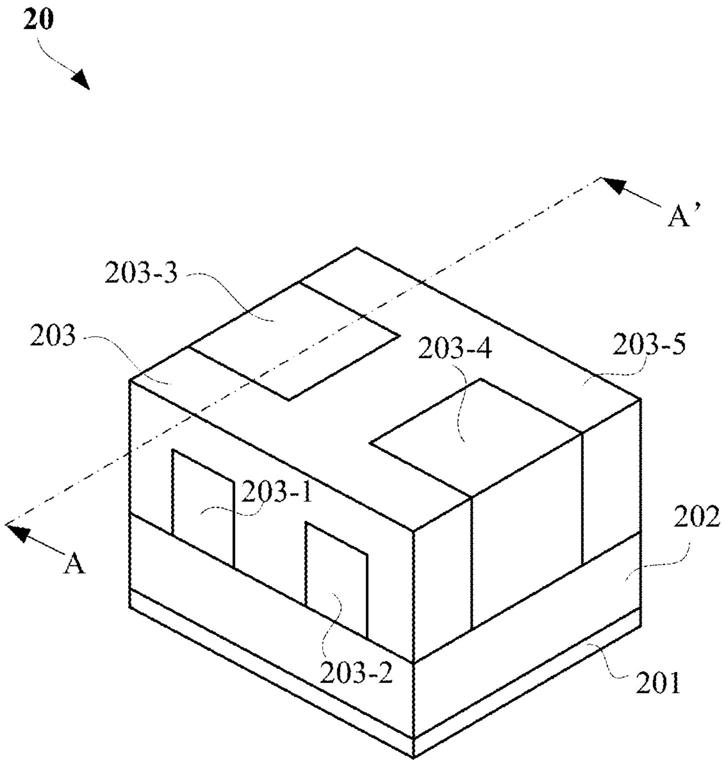
FIG. 2 shows a power module 20 for a dual-phase power converter in accordance with an embodiment of the present invention.

FIG. 2 shows a power module 20 for a dual-phase power converter in accordance with an embodiment of the present invention. The power module 20 may serve as the power stage 102 of FIG. 1, with N=2. The power module 20 includes a bottom substrate 201, a device substrate 202 and an inductor assembly 203. The bottom substrate 201 is arranged at the bottom of the power module 20. The device substrate 202 is arranged on the bottom substrate 201. The inductor assembly 203 is arranged on the device substrate 202. Power device chips integrating the components of the power blocks 103 shown in FIG. 1 is embedded within the device substrate 202. The inductors L are integrated in the inductor assembly 203.

Figure 3:
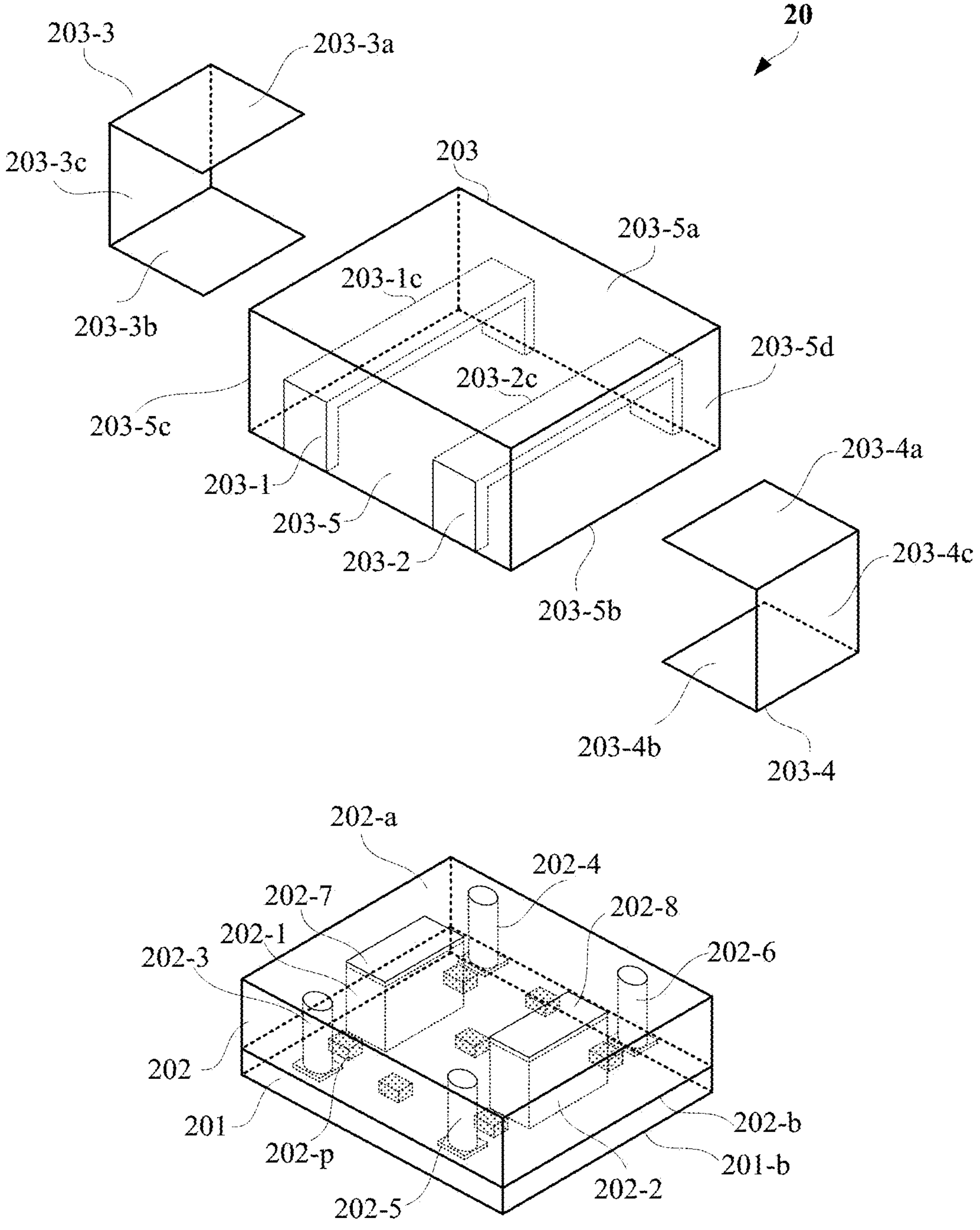
FIG. 3 shows a disassembled and perspective view illustrating the power module 20 of FIG. 1.

FIG. 3 shows a disassembled and perspective view illustrating the power module 20 of FIG. 2. As shown in FIG. 3, the device substrate 202 includes a first power device chip 202-1, a second power device chip 202-2, a first pair of connecting pillars 202-3 and 202-4, a second pair of connecting pillars 202-5 and 202-6, and a plurality of discrete components 202-*p* embedded within the device substrate 202. Each one of the first power device chip 202-1 and the second power device chip 202-2 integrates one power block 103 in FIG. 1, which includes the switches M1, M2, the driver DR1, and further integrates some auxiliary circuits not shown in FIG. 1. The first pair of the connecting pillars includes a first connecting pillar 202-3 and a second connecting pillar 202-4 arranged at opposite sides of the first power device chip 202-1. The second pair of the connecting pillars includes a third connecting pillar 202-5 and a fourth connecting pillar 202-6 arranged at opposite sides of the second power device chip 202-2. Each one of the connecting pillars has a first end connecting out of the device substrate 202, and connected to the corresponding winding of the inductor assembly 203, and a second end connected to the bottom substrate 201. The connecting pillars shown in the example of FIG. 3 are cylinders. It should be appreciated that any shape of the connecting pillars is applicable to the present invention. The discrete components 202-*p* include resistors and capacitors of the power converter 10, like the input capacitors at the input terminal T1 of the power converter 10 for receiving the input voltage Vin to provide pulse current, the filter capacitors and resistors for the drivers DR1 and internal logic circuits power supplies (not shown in FIG. 1), etc.

In the example of FIG. 3, the inductor assembly 203 includes a magnetic core 203-5, a first winding 203-1 and a second winding 203-2 passing through the magnetic core 203-5. The first winding 203-1 and the magnetic core 203-5 form a first inductor L-1 as shown in FIG. 1. The second winding 203-2 and the magnetic core 203-5 form a second inductor L-2 as shown in FIG. 1. Furthermore, the inductor assembly 203 includes a first heat sink layer 203-3 and a second heat sink layer 203-4, each of which has a "C" shape, and partially wraps the magnetic core 203-5. As can be seen from FIG. 3, the first heat sink layer 203-3 has a first portion 203-3*a* partially covering a first surface 203-5*a* of the magnetic core 203-5, a second portion 203-3*b* partially covering a second surface 203-5*b* of the magnetic core 203-5, and a third portion 203-3*c* connecting the first portion 203-3*a* and the second portion 203-3*b*, and partially covering a third surface 203-5*c* of the magnetic core 203-5, wherein the first surface 203-5*a* and the second surface 203-5*b* are opposite, and the third surface 203-5*c* is vertical to the first surface 203-5*a* and the second surface 203-5*b*. The second heat sink layer 203-4 has a first portion 203-4*a* partially covering the first surface 203-5*a*, a second portion 203-4*b* partially covering the second surface 203-5*b*, and a third portion 203-4*c* connecting the first portion 203-4*a* and the second portion 203-4*b*, and covering a fourth surface 203-5*d* of the magnetic core 203-5, wherein the fourth surface 203-5*d* is opposite to the third surface 203-5*c*, and is vertical to the first surface 203-5*a* and the second surface 203-5*b* of the magnetic core 203-5. The surfaces of the magnetic core 203-5 are also referred as surfaces of the inductor module 203. It should be appreciated that the first heat sink layer 203-3 and the second heat sink layer 203-4 are configured for transferring heat from the power device chips to the environment or external components. The shape of the first heat sink layer 203-3 and the second heat sink layer 203-4 may be varying in different applications, e.g., the first heat sink layer 203-3 may have a "L" shape with the second portion 203-3*b* and the third portion 203-3*c*, and similarly, the second heat sink layer 203-4 may have a "L" shape with the second portion 203-4*b* and the third portion 203-4*c*.

Figure 4:
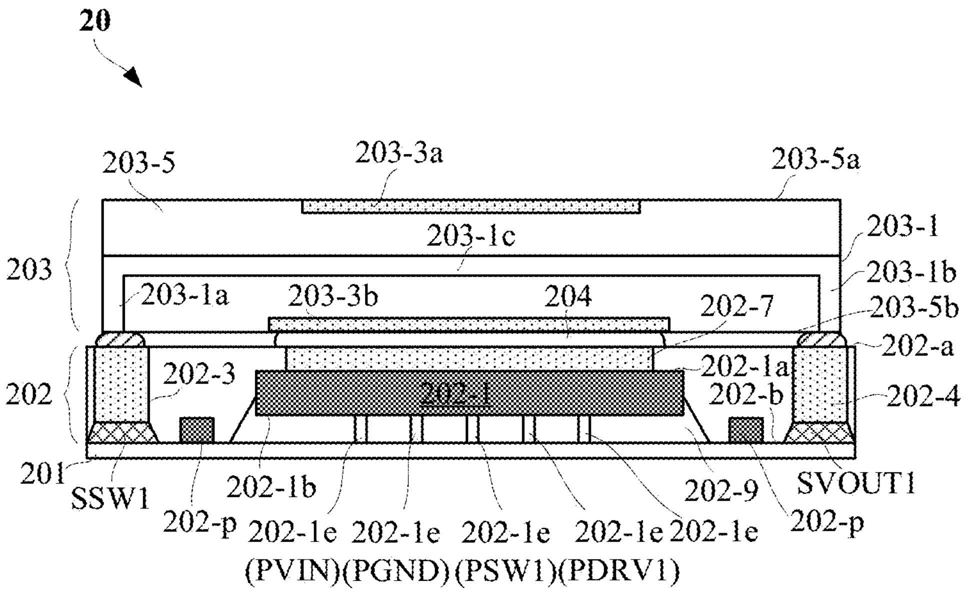
FIG. 4 shows a cross sectional view illustrating the power module 20 taken along AA' line of FIG. 1 in accordance with an embodiment of the present invention.
Figure 5:
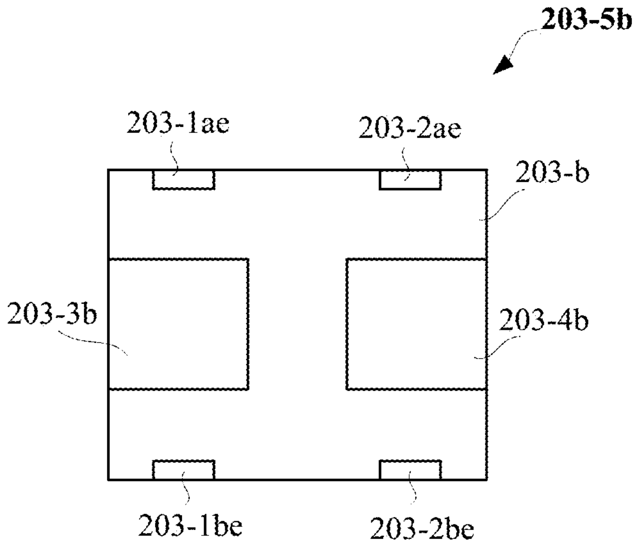
FIG. 5 shows a bottom view of the inductor assembly 203 in accordance with an embodiment of the present invention.
Figure 6:
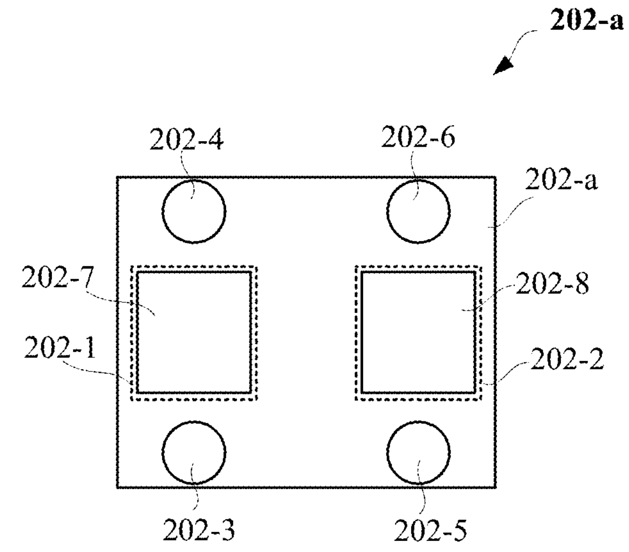
FIG. 6 shows a top view of the device substrate 202 in accordance with an embodiment of the present invention.
Figure 7:
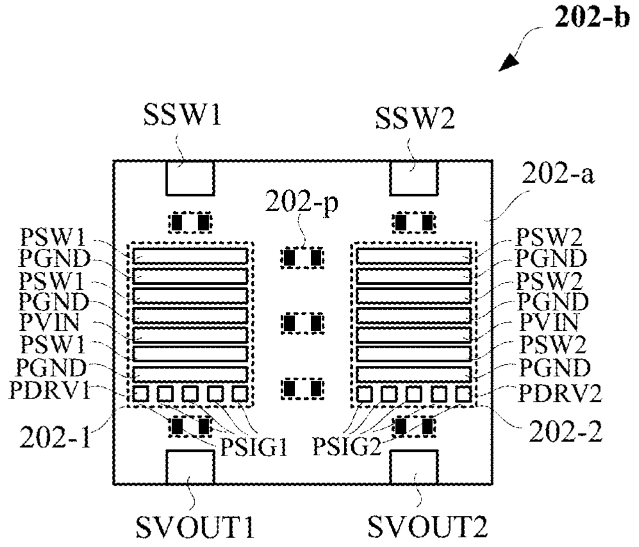
FIG. 7 shows a bottom view of the device substrate 202 in accordance with an embodiment of the present invention.

FIG. 4 shows a cross-sectional view illustrating the power module 20 taken along AA' line of FIG. 2 in accordance with an embodiment of the present invention. FIG. 5 shows a bottom view of the inductor assembly 203, i.e., the second surface 203-5*b* of the inductor assembly 203, in accordance with an embodiment of the present invention. FIG. 6 shows a top view of the device substrate 202, i.e., the first surface 202-*a* of the device substrate 202, in accordance with an embodiment of the present invention. FIG. 7 shows a bottom view of the device substrate 202, i.e., the second surface 202-*b* of the device substrate 202, in accordance with an embodiment of the present invention. The structure of the power module 20 will be illustrated with reference to FIGS. 3~7.

As shown in FIG. 4, the first power device chip 202-1 has a first surface 202-1*a* and a second surface 202-1*b*. The first surface 202-1*a* is covered by a top heat layer 202-7 as shown in FIGS. 4 and 6, and the second surface 202-1*b* has a plurality of pins 202-1*e* (including pins PVIN, PGND, PSW1, PDRV1, and etc.) exposed on the second surface 202-*b* of the device substrate 202 as shown in FIGS. 4 and 7, and connected to the bottom substrate 201. Similarly, The first surface 202-2*a* of the second power device chip 202-2 is covered by a top heat layer 202-8 as shown in FIG. 6, and the second surface 202-2*b* of the second power device chip 202-2 has a plurality of pins 202-2*e* (including pins PVIN, PGND, PSW2, PDRV2, and etc.) exposed on the second surface 202-*b* of the device substrate 202 as shown in FIG. 7, and connected to the bottom substrate 201. It should be appreciated that the pins shown in FIGS. 4 and 7 are for illustration purpose. More pins may be configured in a real application. Furthermore, the pin shape, the pin size and the pin distribution would be varying in different applications. The top heat layer 202-7 and the top heat layer 202-8 are heat disposal layers, which are made of copper in one embodiment, and are made of other material in other embodiments. Persons of ordinary skill in the art should appreciate that any suitable layer configured to transfer heat from the power device chip is applicable as the top heat layer. In one embodiment, the first portion 203-3*a* of the first heat sink layer 203-3 and the first portion 203-4*a* of the second heat sink layer 203-4 are extending to each other and merged as one piece. In one embodiment, the second portion 203-3*b* of the first heat sink layer 203-3 and the second portion 203-4*b* of the second heat sink layer 203-4 are extending to each other and merged as one piece. In one embodiment, the first portion 203-3*a* of the first heat sink layer 203-3 and the first portion 203-4*a* of the second heat sink layer 203-4 are removed, and a heat radiator may remove heat from the first power device chip 202-1 and the second power device chip 202-2 via the third portion 203-3*c* of the first heat sink layer 203-3 and the third portion 203-4*c* of the second heat sink layer 203-4. Similarly, the top heat layer 202-7 and the top heat layer 202-8 could be merged as a whole piece.

As mentioned before, the first power device chip 202-1 integrates the switches M1, M2, the driver DR1 shown in FIG. 1, and other accessory circuits not shown in FIG. 1. The plurality of pins 202-1*e* of the first power device chip 202-1 includes at least an input pin PVIN, a switching pin PSW1, a ground pin PGND, and a driving pin PDRV1 as shown in FIG. 7. The first switch M1 has a first terminal coupled to the input pin PVIN (corresponding to the input terminal T1 in FIG. 1) to receive the input voltage Vin (shown in FIG. 1), a second terminal connected to the switching pin PSW1 (corresponding to the switching terminal S1 in FIG. 1), and a control terminal configured to receive a first driving signal G1. The second switch M2 has a first terminal connected to the switching pin PSW1, a second terminal connected to the ground pin PGND, and a control terminal configured to receive a second driving signal G2. The driver DR1 is coupled to the driving pin PDRV1 to receive a phase control signal 105, and to provide the first driving signal G1 and the second driving signal G2 based on the phase control signal 105. The plurality of pins of the power device chips 202-1 and 202-2 are electrically connected to external circuits/devices/components via the bottom substrate 201. The bottom substrate 201 may be attached to a mainboard where the load (CPU, GPU, etc.) located, and there may be circuits/devices/components on the mainboard providing the input voltage Vin, the phase control signal 105, and a ground reference GND that provides a common ground for the first power device chip 202-1 and the second power device chip 202-2 via the ground pins PGND.

It should be appreciated that the second power device chip 202-2 has the same structure as the first power device chip 202-1, and is not discussed for the brevity of description.

The first winding 203-1 and the second winding 203-2 are embedded in the magnetic core 203-5 and have an upside-down "U" shape, and are parallel to each other. In the example shown in FIG. 4, the first winding 203-1 has a first portion 203-1*a* and a second portion 203-1*b* having ends 203-1*ae* and 203-1*be* connected out of the second surface 203-5*b* of the magnetic core 203-5, and has a middle portion 203-1*c* parallel to the first surface 203-5*a* of the magnetic core 203-5 and connecting the first portion 203-1*a* and the second portion 203-1*b*. The end 203-1*ae* of the first portion 203-1*a* of the first winding 203-1 connects out of the second surface 203-5*b* of the magnetic core 203-5 as shown in FIG. 5, and is electrically connected to the first connecting pillar 202-3 embedded within the device substrate 202 by soldering or other connecting means as shown in FIG. 4. The end 203-1*be* of the second portion 203-1*b* of the first winding 203-1 connects out of the second surface 203-5*b* of the magnetic core 203-5 as shown in FIG. 5, and is electrically connected to the second connecting pillar 202-4 embedded within the device substrate 202 by soldering or other connecting means as shown in FIG. 4. It should be appreciated that the second winding 203-2 has the similar structure with the first winding 203-1 as shown in FIG. 3, and has two ends 203-2*ae* and 203-2*be* electrically connected to third connecting pillar 202-5 and the fourth connecting pillar 202-6 respectively.

The second portion 203-3*b* of the first heat sink layer 203-3 partially covers the second surface 203-5*b* of the magnetic core 203-5 as shown in FIG. 5, and is attached to the top heat layer 202-7 directly or via a heat conductive contact 204 as shown in the example of FIG. 4. Similarly, the second portion 203-4*b* of the second heat sink layer 203-4 partially covers the second surface 203-5*b* of the magnetic core 203-5 as shown in FIG. 5, and is attached to a top heat layer on top of the second power device chip 202-2 directly or via a heat conductive contact. In one embodiment, the heat sink layers 203-3 and 203-4 are made of copper, and dissipate heat from the top heat layers on top of the power device chips 202-1 and 202-2. Consequently, the heat of the power device chips 202-1 and 202-2 are dissipated via the top heat layers 202-7 and 202-8 and the heat sink layer 203-3 and 203-4, respectively. The heat sinks 203-3 and 203-4 are attached to the magnetic core 203-5 by either thermal glue, thermal paste, or direct contact.

The first connecting pillar 202-3 has one end connecting out of the first surface 202-*a* of the device substrate 202 as shown in FIG. 6, and connected to the end of the first portion 203-1*a* of the first winding 203-1 as shown in FIG. 4, and has the other end connected to the bottom substrate 201 via a first switching terminal SSW1. Furthermore, the end of the first portion 203-1*a* of the first winding 203-1, and the first connecting pillar 202-3, are electrically connected to the switching pin PSW1 of the first power device chip 202-1 via conductive traces inside the bottom substrate 201. Consequently, the heat of the first power device chip 202-1 is further dissipated through the first connecting pillar 202-3 and the first winding 203-1. The second connecting pillar 202-4 has one end connecting out of the first surface 202-*a* of the device substrate 202 and connected to the end of the second portion 203-1*b* of the first winding 203-1, and has the other end connected to the bottom substrate 201 via a first output voltage terminal SVOUT1. The third connecting pillar 202-5 has one end connecting out of the first surface 202-*a* of the device substrate 202 as shown in FIG. 6, and connected to the end 203-2*ae* of the first portion 203-2*a* of the second winding 203-2 shown in FIG. 5, and has the other end connected to the bottom substrate 201 via a second switching terminal SSW2. The end 203-2*ae* of the first portion 203-2*a* of the second winding 203-2, and the third connecting pillar 202-5, are electrically connected to the switching pin PSW2 of the second power device chip 202-2 via conductive traces inside the bottom substrate 201. Consequently, the heat of the second power device chip 202-2 is further dissipated through the third connecting pillar 202-5 and the second winding 203-2. The fourth connecting pillar 202-6 has one end connecting out of the first surface 202-*a* of the device substrate 202 and connected to the end 203-2*be* of the second portion 203-2*b* of the second winding 203-2, and has the other end connected to the bottom substrate 201 via a second output voltage terminal SVOUT2. In some embodiments of the present invention, the connecting pillars 202-3~202-6 are soldered to the bottom substrate 201, and the first switching terminal SSW1, the first output voltage terminal SVOUT1, the second switching terminal SSW2 and the second output voltage terminal SVOUT2 are solder pastes at the ends of the connecting pillars 202-3~202-6. It should be appreciated that the connecting pillars 202-3~202-6 may be connected to the bottom substrate 201 directly, or by other connecting means known in the art, e.g., the connecting pillars 202-3~202-6 may be protruded out of the bottom surface 202-*b* of the device substrate 202, and are inserted to grooves of the bottom substrate 201.

As shown in FIG. 7, the first power device chip 202-1 has signal pins PSIG1 which may be configured to transmit temperature monitoring signal, current monitoring signal, and other necessary signals for communicating between the first power device chip 202-1 and external circuits. The second power device chip 202-2 has signal pins PSIG2 which may be configured to transmit temperature monitoring signal, current monitoring signal, and other necessary signals for communicating between the second power device chip 202-2 and external circuits. In FIG. 7, the driving pin PDRV1 is illustrated as an example of signal pins PSIG1, and the driving pin PDRV2 is illustrated as an example of signal pins PSIG2. Other signal pins, like the pins for transmitting the temperature monitoring signal, the current monitoring signal, etc., are not specifically labeled for brevity. The discrete components 202-*p* together with the power device chips 202-1 and 202-2 which are molded within the device substrate 202 have connecting terminals on the second surface of the device substrate 202. As shown in the embodiment of FIG. 7, each one of the discrete components 202-*p*, i.e., the capacitors and the resistors, has two pins or pads exposed on the second surface 202-*b* of device substrate 202, and connected to the bottom substrate 201, wherein the discrete components 202-*p* are electrically connected to the power device chips 202-1, 202-2, and external components/circuits via the bottom substrate 201. Persons of ordinary skill in the art should know that the pins shown in FIG. 7 are for illustrating, which should not be limiting the present invention. The pin distribution on the second surface of the device substrate 202 is determined by the requirement of the application specs, and is varying in different applications.

Figure 8:
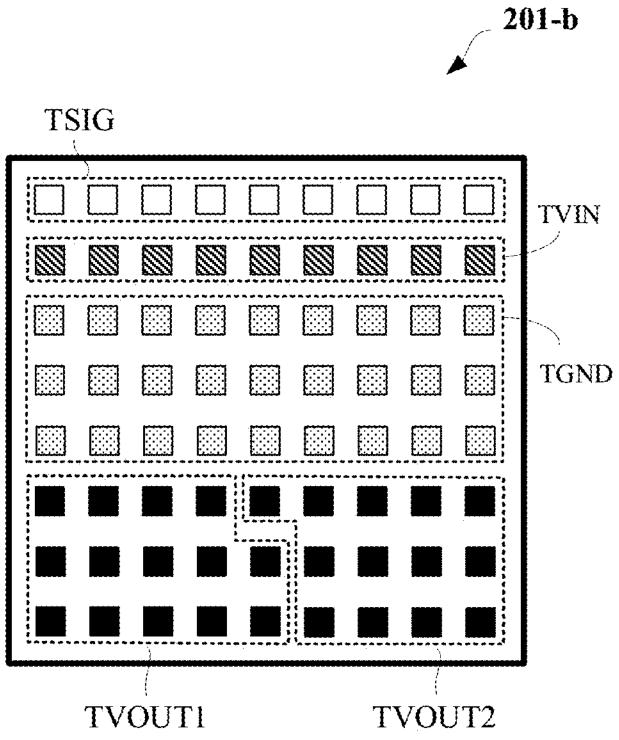
FIG. 8 shows a bottom view of the bottom substrate 201 in accordance with an embodiment of the present invention.

FIG. 8 shows a bottom view of the bottom substrate 201, i.e., the second surface 201-*b* of the bottom substrate 201, in accordance with an embodiment of the present invention. The second surface 201-*b* of the bottom substrate 201 includes a signal pad area TSIG, an input pad area TVIN, a ground pad area TGND, a first output voltage pad area TVOUT1 and a second output voltage pad area TVOUT2. Each one of the pad areas includes a plurality of pads. The pads on the second surface 201-*b* of the bottom substrate 201 connect through to the first surface 201-*a* of the bottom substrate 201 using, e.g., vias and conductive traces inside the bottom substrate 201. The plurality of pads of the signal pad area TSIG are electrically connected to the signal pins PSIG1 of the first power device chip 202-1 and the signal pins PSIG2 of the second power device chip 202-2 respectively, like the driving pins PDRV1, PDRV2, temperature monitoring pins, etc. The plurality of pads of the input pad area TVIN are electrically connected to the input pins PVIN of the first power device chip 202-1 and the second power device chip 202-2. The plurality of pads of the ground pad area TGND are electrically connected to the ground pins PGND of the first power device chip 202-1 and the second power device chip 202-2. The plurality of pads of the first output voltage pad area TVOUT1 are electrically connected to the end of the second portion 203-1*b* of the first winding 203-1 via the second connecting pillar 202-4. The plurality of pads of the second output voltage pad area TVOUT2 are electrically connected to the end of the second portion 203-2*b* of the second winding 203-2 via the fourth connecting pillar 202-6. In one embodiment, the pads of the first output voltage pad area TVOUT1 and the pads of the second output voltage pad area TVOUT2 are electrically disconnected, which makes the power module 20 work as two independent converters. In some embodiments, the pads of the first output voltage pad area TVOUT1 and the pads of the second output voltage pad area TVOUT2 are electrically connected by external conductive traces or traces inside the bottom substrate, which makes the power module 20 work as a dual-phase power converter.

In the present invention, by stacking the bottom substrate 201, the device substrate 202 and the inductor assembly 203 vertically, the power density is increased. The first portions and the second portions of the first winding and the second winding are exposed to the side surfaces of the magnetic core as shown in the embodiments of the present invention. It should be appreciated that the first portions and the second portions of the first winding and the second winding could be totally embedded inside the magnetic core, thereby switching noise is shielded by the magnetic core 205 and the device substrate 202 of the power module 20, thus better noise immunity is provided compared to the prior art power modules.

In the present invention, the power device chips embedded within the device substrate dissipate heat from the top, i.e., through the top heat layers, and meanwhile from the bottom, i.e., through the pins attached to the bottom substrate, and then further through the windings and magnetic core of the inductor assembly, which makes the heat dissipation performance excellent.

In one embodiment, the device substrate 202 is formed by firstly attaching the power device chips 202-1 and 202-2, the discrete components 202-*p*, and the connecting pillars 202-3~202-6 to the bottom substrate 201, and secondly molding all the aforementioned components together. The power module 20 could be produced by stacking the inductor module 203 on top (first surface 202-*a*) of the device substrate 202, which highly eases the manufacturability and improves the robustness.

It should be appreciated that the device substrate 202 could also be implemented by other means, e.g., by PCB (Printed Circuit Board) process. Specifically, the power device chips 202-1 and 202-2, the discrete components 202-*p*, and the connecting pillars 202-3~202-6 could be integrated in a PCB or be embedded by several PCB layers.

In one embodiment, the bottom substrate 201 is implemented by a PCB layer.

Figure 9:
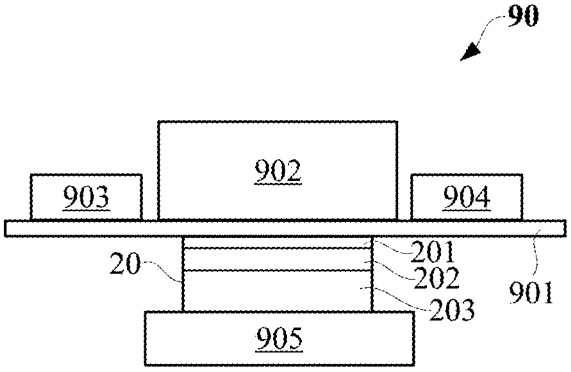
FIG. 9 is a side view illustrating a system 90 employing the power module 20 in accordance with an embodiment of the present invention.

FIG. 9 is a side view illustrating a system 90 employing the power module 20 in accordance with an embodiment of the present invention. The system 90 includes a mainboard 901, a load 902, external components 903, 904, the power module 20, and a heat radiator 905. In the embodiment of FIG. 9, the load 902 and the power module 20 are attached to the opposite surfaces of the mainboard 901, which shorts the power delivery path, and improves the power efficiency. The load 902 may be a CPU, a GPU, or any other microprocessors. The power module 20 is attached to the mainboard 901 by the bottom substrate 201. The top of the power module 20 is covered by the heat radiator 905 for heat dissipation. The external components 903 and 904 may be the devices providing power, i.e., the input voltage Vin, or providing the phase control signals 105, to the power module 20. In other embodiments, the power module 20 and the load 902 may be placed on the same surface of the mainboard 901.

The power module for the dual-phase power converter is described for illustrating the present invention. It should be appreciated that the power module in the present invention could be scaled in by including a single power device chip and a single inductor to implement a single-phase power converter, or be scaled out by including more power device chips and inductors to implement multiple power converters or a multi-phase power converter.

Obviously, many modifications and variations of the present invention are possible in light of the above teachings. It is therefore to be understood that within the scope of the appended claims the invention may be practiced otherwise than as specifically described. It should be understood, of course, the foregoing disclosure relates only to a preferred embodiment (or embodiments) of the invention and that numerous modifications may be made therein without departing from the spirit and the scope of the invention as set forth in the appended claims. Various modifications are contemplated and they obviously will be resorted to by those skilled in the art without departing from the spirit and the scope of the invention as hereinafter defined by the appended claims as only a preferred embodiment(s) thereof has been disclosed.

What is claimed is:

1. A power module, comprising:

a device substrate having a first surface and a second surface opposite to the first surface; and an inductor assembly arranged on the device substrate, wherein the device substrate comprises:

at least one power device chip embedded within the device substrate; and at least one pair of connecting pillars embedded within the device substrate, wherein the at least one pair of connecting pillars comprises a first connecting pillar and a second connecting pillar arranged at opposite sides of the at least one power device chip; wherein the at least one power device chip has a first surface covered by a top heat layer exposed on the first surface of the device substrate, and a second surface comprising a plurality of pins exposed on the second surface of the device substrate, and wherein the first surface and the second surface of the at least one power device chip are opposite, and wherein the inductor assembly comprises:

a magnetic core having a first surface and a second surface opposite to the first surface of the magnetic core; and at least one winding passing through the magnetic core, wherein the at least one winding has a first portion, a second portion and a middle portion connecting the first portion and the second portion, wherein the first portion and the second portion of the at least one winding are vertical to the first surface of the magnetic core, and the middle portion of the at least one winding is parallel to the first surface of the magnetic core, and wherein the first portion and the second portion of the at least one winding respectively has an end connected out of the second surface of the magnetic core.

2. The power module of claim 1, further comprising a bottom substrate having a first surface attached to the second surface of the device substrate and a second surface having a plurality of pads, wherein the first surface and the second surface of the bottom substrate are opposite, and wherein some of the plurality of pins of the at least one power device chip are electrically connected to some of the plurality of pads on the second surface of the bottom substrate respectively.

3. The power module of claim 2, wherein the at least one power device chip comprises:

an input pin;

a switching pin;

a ground pin;

a driving pin;

a first switch having a first terminal coupled to the input pin, a second terminal coupled to the switching pin, and a control terminal configured to receive a first driving signal;

a second switch having a first terminal coupled to the switching pin, a second terminal coupled to the ground pin, and a control terminal configured to receive a second driving signal; and a driver coupled to the driving pin to receive a phase control signal, and to provide the first driving signal and the second driving signal based on the phase control signal;

wherein the plurality of pads on the second surface of the bottom substrate are zoned into an input pad area, a ground pad area, a signal pad area, a first output voltage pad area and a second output voltage pad area, and wherein each one of the input pad area, the ground pad area, the signal pad area, the first output voltage pad area and the second output voltage pad area comprises at least one pad;

the input pin of the at least one power device chip is electrically connected to the at least one pad of the input pad area on the second surface of the bottom substrate;

the ground pin of the at least one power device chip is electrically connected to the at least one pad of the ground pad area on the second surface of the bottom substrate; and the driving pin of the at least one power device chip is electrically connected to the at least one pad of the signal pad area on the second surface of the bottom substrate.

4. The power module of claim 2, wherein:

the first connecting pillar has a first end connected to one end of the at least one winding and a second end connected out of the second surface of the device substrate to the bottom substrate; and the second connecting pillar has a first end connected to the other end of the at least one winding and a second end connected out of the second surface of the device substrate to the bottom substrate.

5. The power module of claim 1, wherein the inductor assembly comprises at least one heat sink layer partially wrapping the magnetic core, and wherein the at least one heat sink layer has a portion disposed on the second surface of the magnetic core, and is attached to the top heat layer covering the at least one power device chip.

6. The power module of claim 1, wherein the inductor assembly comprises at least one heat sink layer partially wrapping the magnetic core, and wherein the at least one heat sink layer has a portion disposed on the second surface of the magnetic core, and is connected to the top heat layer covering the at least one power device chip via a heat conductive contact.

7. The power module of claim 1, wherein the inductor assembly comprises at least one heat sink layer having a "C" shape partially wrapping the magnetic core, and wherein the at least one heat sink layer has a first portion partially covering the first surface of the magnetic core, a second portion partially covering the second surface of the magnetic core and meanwhile attached to the top heat layer covering the at least one power device chip, and a third portion partially covering a third surface of the magnetic core, and wherein the third surface of the magnetic core is vertical to the first surface and the second surface of the magnetic core, and is parallel to the middle portion of the at least one winding.

* * * * *